United States Patent
Chang et al.

[11] Patent Number: 6,047,387
[45] Date of Patent: Apr. 4, 2000

[54] SIMULATION SYSTEM FOR TESTING AND DISPLAYING INTEGRATED CIRCUIT'S DATA TRANSMISSION FUNCTION OF PERIPHERAL DEVICE

[75] Inventors: Alber Chang, Hsinchu; Crystal Chu, Hsi Chih; Jyh-Hwang Wang, Hsinchu, all of Taiwan

[73] Assignee: Winbond Electronics Corp., Hsinchu, Taiwan

[21] Appl. No.: 09/045,760

[22] Filed: Mar. 20, 1998

[30] Foreign Application Priority Data

Dec. 16, 1997 [TW] Taiwan ................................. 86220885

[51] Int. Cl.[7] .................................................... G06F 13/00
[52] U.S. Cl. ................................. 714/33; 714/26; 714/28
[58] Field of Search ................................. 714/33, 28, 26

[56] References Cited

U.S. PATENT DOCUMENTS

| | | | |
|---|---|---|---|
| 5,574,854 | 11/1996 | Blake et al. | 395/183.04 |
| 5,640,337 | 6/1997 | Huang et al. | 364/578 |
| 5,680,542 | 10/1997 | Mulchandani et al. | 395/183.04 |
| 5,684,946 | 11/1997 | Ellis et al. | 395/183.09 |
| 5,950,004 | 9/1999 | Beanse et al. | 395/705 |

*Primary Examiner*—Norman Michael Wright
*Attorney, Agent, or Firm*—Thomas, Kayden, Horstemeyer & Risley

[57] ABSTRACT

A system implement simulation system's capable of facilitating integrated circuit designers to perform a complete integrated circuit testing with respect to a target peripheral device and demonstrate various functions and their sequence of operations without having to build the target device physically. The system allows, reliability and quality of an integrated circuit design to be increased, and production and testing costs can be reduced. The simulation system is capable of performing functional checking at any time, and can be utilized in demonstrating product functions to customer.

18 Claims, 1 Drawing Sheet

SIMULATION SYSTEM FOR TESTING AND DISPLAYING INTEGRATED CIRCUIT'S DATA TRANSMISSION FUNCTION OF PERIPHERAL DEVICE

CROSS-REFERENCE TO RELATED APPLICATION

This application claims the priority benefit of Taiwan application serial no. 86220885, filed Dec. 16, 1997, the full disclosure of which is incorporated herein by reference.

BACKGROUND OF THE INVENTION

1. Field of Invention

The present invention relates to a functionality test for the integrated circuit within a peripheral device. More particularly, the present invention relates to a simulation system operating between a host computer environment and a peripheral device environment such that data transmission function with the peripheral device is tested and the result displayed.

2. Description of Related Art

Most systems that operates to test the integrated circuit function of a peripheral device must carry out the testing by actually integrating the integrated circuit (IC) or an earlier state such as field programmable gate array (FPGA) with other components and structures in the peripheral device. For example, the decoding IC in a CD-ROM must be combined with the servo IC of the CD-ROM before the actual inspection of data decoding function can be carried out. The parallel interface IC in a printer must be combined with the printing mechanism. The scanner-host bus interface IC in a scanner must be combined with part of the scanner components and structures in order to inspect data transmission and processing functions of the scanner.

At present, integrated circuit design is an upstream production activity while the design of peripheral device is further down. In order to inspect the functionality of integrated circuit design in a peripheral device, two major routes are commonly opted for in most companies, namely:

I. An agreement is searched with peripheral device manufacturers or companies to develop the integrated circuit jointly. Design rules for operating the integrated circuit and the peripheral device is then fully discussed, and the design scheme is implemented separately. Afterwards, the two designs are put back together for testing the design functions. Any errors in the system that may occur during this phase can be removed by further discussions of the original designs. However, the defects of this type of co-operation are:

(1) Once an error occurs, it is very difficult to judge whether the error results from design faults in the integrated circuit or the peripheral device or both.

(2) Full co-operation can be difficult at times, especially when trade secrets or business opportunities is involved between the agreed parties. Furthermore, it is very difficult to introduce the same integrated circuit design to other customers without arousing contractual disagreement between co-operating parties.

(3) Different companies may have different priorities in their designs. Therefore, it is very easy to have conflicts in IC designs resulting in a barrier for co-operation.

(4) This kind of arrangement involves obligations and responsibilities between parties, and can easily subject to a conflict of interest. Therefore, development of integrated circuit is really at a great disadvantage.

II. Integrated circuit design companies purchase standard peripheral devices from the market, and then carry out a few changes to enable functional testing of the integrated circuit. This, however, suffers the following drawbacks:

(1) The operational mode of the peripheral devices is completely fixed by the peripheral device manufacturer, and so it is very difficult to test new functions.

(2) Unless the integrated circuit design is compatible pin-by-pin with the peripheral devices, it is very difficult to operate efficiently.

(3) Testing rate for the integrated circuit functions is rather low. Therefore, reliability of the design is difficult to raise, and the quantity and probability of a change in version is going to be more frequent. Consequently, design and sample making cost is relatively high, which will develop unfavorably circumstances for bringing in the integrated circuit promptly to the market.

In light of the foregoing, there is a need to design a method for improving the current situation.

SUMMARY OF THE INVENTION

Accordingly, the present invention is to provide a simple yet easy to implement simulation system that facilitates integrated circuit designers to complete the testing of integrated circuit functions and their sequential execution relationships on a target peripheral device without actual connection with the target peripheral devices.

Through this simulation system, reliability of integrated circuit design can be greatly increased. Moreover, quality of integrated circuit products can be improved, and cost for designing IC, fabrication and testing can be lowered. Furthermore, the invention can be used to perform functional testing on a particular integrated circuit product according to customer's requirement, therefore able to demonstrate the principal of operation of a particular integrated circuit product to a customer at any time.

To achieve these and other advantages and in accordance with the purpose of the invention, as embodied and broadly described herein, the invention provides a simulation system simulating an environment having a host computer and a peripheral device.

The simulation system comprises a software simulation module, a peripheral device integrated circuit and its connection logic module, a simulation firmware and its connection logic module, a first transmission interface, a second transmission interface, and a third transmission interface. The software simulation module is connected to the peripheral device IC and its connection logic module through the first transmission interface. The peripheral device IC and its connection logic module are connected to the simulation firmware and its connection logic module through the third transmission interface; and, the software simulation module is connected to the simulation firmware and its connection logic module through the second transmission interface.

According to one aspect of this invention, the software simulation module further includes a first operating program and a second operating program, wherein the first operating program processes data coming from the first transmission interface and controlling the peripheral device for carrying out data transmission; the second operating program processes data coming from the second transmission interface and also controlling the simulation firmware and its connection logic module to carry out signal correspondence and data transmission with the peripheral device IC and its connection logic module.

According to another aspect of this invention, the software simulation module operates under a host computer environment for transmitting and receiving control instructions and data. Those instructions are processed and then the data are compared with the intended result to assess the precision of return signals, thus achieving a functionality testing necessary for the peripheral device.

According to yet another aspect of this invention, the peripheral device IC and its connection logic module is a target device for testing by the simulation system. The peripheral device IC and its connection logic module receives signals from the first transmission interface and correspondence signals from the simulation firmware and its connection logic module, and then functional operations and data transmission are executed within for checking their correctness in the peripheral device.

According to a fourth aspect of this invention, the simulation firmware and its connection logic module is used to simulate the correspondence signal of a particular peripheral device interface. The simulation firmware and its connection logic module are located between the peripheral device IC and its connection logic module and the second operating program for data transmission and processing.

According to a fifth aspect of this invention, the first operating program processes the data from the first transmission interface and controls data transmission of the peripheral device. The second operating program processes the data from the second transmission interface, and also controls the signal correspondence and data transmission between the simulation firmware and its connection logic module and the peripheral device IC and its connection logic module.

The simulation system of this invention uses the peripheral device IC and its connection logic module, the simulation firmware and its connection logic module, the second operating program, the second transmission interface and the third transmission interface to simulate all the available functional operations of any particular peripheral device.

It is to be understood that both the foregoing general description and the following detailed description are exemplary, and are intended to provide further explanation of the invention as claimed.

BRIEF DESCRIPTION OF THE DRAWINGS

The accompanying drawing is included to provide a further understanding of the invention, and is incorporated in and constitutes a part of this specification. The drawing illustrates embodiments of the invention and, together with the description, serves to explain the principles of the invention. In the drawing.

DESCRIPTION OF THE PREFERRED EMBODIMENTS

Figure 1:
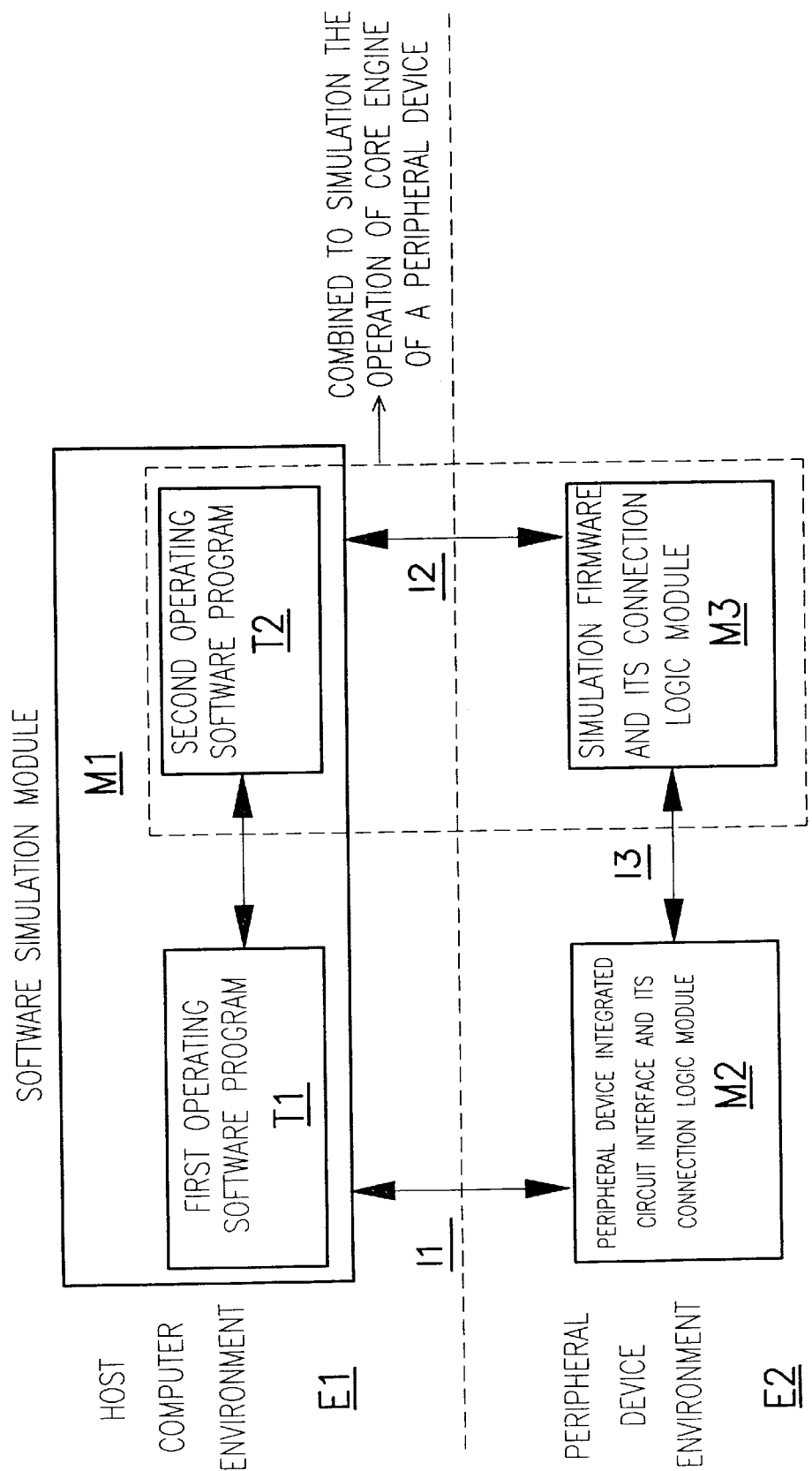
FIG. 1 is a block diagram showing the simulation system according to the embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

The simulation system of this invention is divided into three main modules, namely, a software simulation module, a peripheral device IC and its connection logic module and a simulation firmware and its connection logic module, respectively. They are working under either the host computer environment or the peripheral device environment.

FIG. 1 is a block diagram showing the simulation system according to the embodiment of this invention. As shown in FIG. 1, M1 represent the software simulation module working under a host computer environment E1. The software simulation module M1 is used for transmitting and receiving control instructions and data, as well as processing the instructions and performing data comparison operation for ascertaining the functional correctness of the peripheral device.

The software simulation module M1 can be written with any kind of computer languages, and the module includes a first operating program (thread 1) T1 and a second operating program (thread 2) T2. The first operating program T1 processes signals coming from the standard software/hardware interface I1, and controls the data transmission to or from the peripheral device. The second operating program T2 processes signals coming from another software/hardware interface I2, and controls the data transmission to or from a simulation firmware module M3, which in turn carries out signal correspondence and data transmission with a peripheral device IC module M2.

M2 represents a peripheral device IC and its connection logic module, and is a target module for carrying out functional checking in this simulation system. Module M2 receives signals coming from the standard peripheral device interface I1 of the host computer and the correspondence signals from the simulation firmware and its connection logic module M3, and then carrying out functional operation and data transmission. Hence, the correctness of these functional operations and data transmission can be checked.

M3 represents a simulation firmware and its connection logic module. M3 is used to simulate the correspondence signals appearing in a specified device interface. Module M3 is posed between the peripheral device IC module M2 and the simulation software T2 serving as a data transmission processor. The simulation firmware and its connection logic module M3 use a microprocessor for carrying out firmware simulation.

I1 represents a first transmission interface that acts as a standard interface between a host computer and a peripheral device. The first transmission interface I1 performs standard data transmission and communication functions, and includes standard host-peripheral interface, for example, IEEE1394, USB, AC97, PCMCIA, SCSI, ATA, ATAPI, RS232 and Parallel.

I2 represents a second transmission interface that acts as a standard or non-standard interface with a host computer, for example, RS232, Parallel, ECP, EPP, $I^2C$, SCSI, USB, IEEE1394, or other custom designed interface capable of controlled communication and data transmission with the microprocessor firmware.

I3 represents a third transmission interface that acts as an interface allowing specified control signals to pass to various IC components inside the peripheral device as well as an interface for data transmission.

Besides inspecting the correct functional operations, this simulation system is also capable of checking error processing and error return functions. In addition, the quantity of data to be transmitted through the simulation does not have to be transmitted all at once. Data transmission can be conducted in stages depending on the amount of buffer memory available in the peripheral device and its operational scheme.

The simulation system comprises a first operating program T1 for processing signals coming from the first transmission interface I1 and controlling data transmission of the peripheral device. The simulation system further comprises the second operating program T2 for processing signals coming from the second transmission interface I2 and controlling the simulation firmware and its connection logic module M3 to carry out signal correspondence and data transmission with the peripheral device IC and its connection logic module M2.

Besides, the simulation system further comprises a simulation system that utilizes the peripheral device IC and its connection logic module M2, the simulation firmware and its connection logic module M3, the second operating program T2, the second transmission interface I2 and the third transmission interface I3 to simulate the functional performance of a peripheral device.

Data transmitting peripheral devices can be classified into three main categories, namely: specially designed for data input, specially designed for data output and specially designed for both data input and data output, wherein inputs and outputs are with reference to the host computer.

Examples of peripheral devices that are specially designed for data input include digital scanners, digital still camera (DSC), digital video camera (DVC) and so on. Examples of peripheral devices that are specially designed for data output include printers, drafting machines and so on. Examples of peripheral devices that have data input and output functions include hard disks, floppy disks, back-up tapes system, optical disks and so on.

A peripheral device that is specially designed for data input can be simulated according to the series of steps described below:

Step 1: The first operating program T1 of the software simulation module M1 sends data request instruction and control signals down to the standard interface I1.

Step 2: Peripheral device IC module M2 received the instruction and control signals from the interface I1 and performs appropriate processing operations, and then data input instruction is transmitted to the simulation firmware module M3 through the third interface I3.

Step 3: The simulation firmware module M3 simulates correspondence signals with the interface I3, and then receives data input instruction from the interface I3 and subsequently passed on to the second operating program T2 of the software simulation module M1 through the second interface I2.

Step 4: The second operating program T2 of the software simulation module M1 then sends specified data to the simulation firmware module M3 through the second interface I2.

Step 5: The simulation firmware module M3 simulates the signal correspondence operation with the interface I3 and then transmits data to the peripheral device IC M2 ready for inspection.

Step 6: The peripheral device IC M2 sends the data to the first operating program TI of the software simulation module M1 through the standard interface I1.

Step 7: The first operating program T1 of the software simulation module M1 then compares the data received from the peripheral device IC M2 with the expected data to see if the peripheral device IC M2 are functioning properly. At the same time, the received data can also be displayed on the host computer.

Step 8: Steps 1 through 7 are repeated until the required data are all transmitted.

In the above simulation, Steps 3 to 5 is the core of the operation where the second operating program T2 co-operates with the simulation firmware module M3 to simulate the actual operation of the input peripheral device.

A peripheral device that is specially designed for data output can be simulated according to the series of steps described below:

Step 1: The first operating program T1 of the software simulation module M1 sends data output request instruction and control signals down to the standard interface I1.

Step 2: The peripheral device IC M2 to be inspected follows the instruction and the control signals getting itself ready by performing some processing operations, and then passes the data output instruction to the simulation firmware module M3 through the third interface I3.

Step 3: The simulation firmware module M3 simulates correspondence signals with the interface I3, and then getting itself ready to receive the output data. The simulation firmware module M3 then signals its condition to the second operating program T2 of the software simulation module MI through the second interface I2.

Step 4: After receiving a Ready signal from the peripheral device IC M2, the first operating program T1 of the software simulation module M1 then transmits the output data through the standard interface I1 to the peripheral device IC M2.

Step 5: The peripheral device IC M2 receives the data and then passes on to the simulation firmware module M3 through the third interface I3.

Step 6: The simulation firmware module M3 simulates the signal correspondence operation with the interface I3 and then transmits the received data to the second operating program T2 of the software simulation module M1 through the second interface I2.

Step 7: The second operating program T1 of the software simulation module M1 then compares the data received from the peripheral device IC M2 with the expected data to see if the peripheral device IC M2 are functioning properly. At the same time, the received data can also be displayed on the host computer.

Step 8: If data transmission operation is not finished in the first run, steps 1 through 7 can be repeated until data transmission is complete.

In the above simulation, Steps 3, 5 and 6 is the core of the operation where the second operating program T2 co-operates with the simulation firmware module M3 to simulate the actual operation of the input peripheral device.

For a peripheral device that is designed for both data input and data output, steps for simulating input is similar to the description of the simulation of a peripheral device specially designed for data input, while steps for simulating output is similar to the description of the simulation of a peripheral device specially designed for data output.

In the aforementioned embodiment of this invention, the simulation firmware and its connection logic module together with the second operating program serve to simulate the actual operation of the so-called "core engine" of a peripheral device. Simulating the control of the core engine of a peripheral device can be carried out using either the second operating program of the software simulation module, or the microprocessor inside the simulation firmware module.

As a summary, the advantages of using the simulation system of invention includes:

(1) There is no need for the physical presence of a target peripheral device. Only a host computer for executing the software module of this invention plus target peripheral device simulation hardware and a firmware module are required.

(2) The integrated circuit designers can first perform the design of circuit using a field programmable gate array (FPGA), and then checking each function of the circuit separately before checking as an integrated whole. The checking can be carried out one stage at a time for removing errors or improving functions using the simulation system of this invention.

(3) The simulation system of this invention can be used as a function tester and a development display unit during the early design stage of an integrated circuit.

(4) Reliability of the integrated circuit can be raised, and quality cost can be lowered.

(5) Integrated circuit development time can be reduced, and the number of change in versions can be minimized.

(6) Using software and firmware in the simulation system makes functional changes flexible to implement and subsequent checking of those functional changes more convenient.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A simulation system for checking and displaying data transmission functions carried out by the integrated circuit of a peripheral device, wherein the simulation system operates under a host computer environment and a peripheral device environment, and the simulation system comprises:

a software simulation module including a first operating program and a second operating program;

a peripheral device integrated circuit and its connection logic module;

a simulation firmware and its connection logic module;

a first transmission interface between the software simulation module and the peripheral device integrated circuit and its connection logic module, serving as a standard interface between the host computer and the peripheral device, and acting as a communicative link and a medium for standard data transmission operation;

a second transmission interface between the simulation firmware and its connection logic module and the software simulation module, acting as other standard or non-standard interface provided by the host computer, and serving to control communication and data transmission; and a third transmission interface between the peripheral device integrated circuit and its connection logic module and the simulation firmware and its connection logic module, and serving as an interface for data transmission and an interface for specified control signals that control various integrated circuit control devices inside a peripheral device, wherein the software simulation module operates in the host computer environment for supplying and receiving control instruction and data, and then processing the instruction followed by a data comparison for ascertaining the correctness of the data so that functions of the peripheral device are checked, the first operating program processes the signals coming from the first transmission interface, and controlling data transmission operation of the peripheral device; the second operating program processes the signals coming from the second transmission interface, and controlling the simulation firmware and its connection logic module to carry out signal correspondence and data transmission with the peripheral device integrated circuit and its connection logic module, the peripheral device integrated circuit and its connection logic module is the target for inspection in the simulation system, the peripheral device integrated circuit and its connection logic module receives signals coming from the first transmission interface and the correspondence signals coming from the simulation firmware and its connection logic module, and then performs functional and data transmission operations in order to check the correctness of those operations; the simulation firmware and its connection logic module is used to simulate the specific correspondence signals at the interface of a peripheral device, and is located between the second operating program and the peripheral device integrated circuit and its connection logic module for processing data transmission.

2. The simulation system of claim 1, wherein the simulation firmware and its connection logic module and the second operating program work together to simulate the actual operation of the core engine of the peripheral device.

3. The simulation system of claim 1, wherein the first transmission interface serves as a standard interface between the host computer and the peripheral device, and acts as a communicative link and a medium for standard data transmission operation.

4. The simulation system of claim 1, wherein the second transmission interface includes other standard or non-standard interface provided by the host computer, and serves to control communication and data transmission.

5. The simulation system of claim 1, wherein the third transmission interface serves as an interface for data transmission and an interface for specified control signals that control various integrated circuit control devices inside a peripheral device.

6. The simulation system of claim 1, wherein the simulation firmware and its connection logic module uses a microprocessor to perform firmware simulation.

7. The simulation system of claim 1, wherein the simulation of the control mechanism of the core engine of a peripheral device can be carried out either by the second operating program inside the software simulation module or by the microprocessor inside the simulation firmware module.

8. The simulation system of claim 1, wherein the software of the software simulation module can be composed by any computer languages.

9. The simulation system of claim 1, wherein the first transmission interface that serves as a standard interface between the host computer and the peripheral device includes IEEE1394, USB, AC97, PCMCIA, SCSI, ATA, ATAPI, RS232 or Parallel.

10. A simulation system for simulating the integrated circuit functions within a peripheral device, wherein the simulation system operates under a host computer environment and a peripheral device environment, and the simulation system comprises:

a software simulation module including a first operating program and a second operating program;

a peripheral device integrated circuit and its connection logic module;

a simulation firmware and its connection logic module;

a first transmission interface between the software simulation module and the peripheral device integrated circuit and its connection logic module;

a second transmission interface between the simulation firmware and its connection logic module and the software simulation module; and a third transmission interface between the peripheral device integrated circuit and its connection logic module and the simulation firmware and its connection logic module wherein the first operating program processes the signals coming from the first transmission interface, and controlling data transmission operation of the peripheral device, the second operating program processes the signals coming from the second transmission interface, and controlling the simulation firmware and its connection logic module to carry out signal correspondence and data transmission with the peripheral device integrated circuit and its connection logic module, and the simulation system utilizes the simulation firmware and its connection logic module, the second operating program, the second transmission interface and the third transmission interface to simulate the actual functional operation of the peripheral device.

11. The simulation system of claim 10, wherein the first transmission interface serves as a standard interface between the host computer and the peripheral device, and acts as a communicative link and a medium for standard data transmission operation.

12. The simulation system of claim 10, wherein the second transmission interface includes other standard or non-standard interface provided by the host computer, and serves to control communication and data transmission.

13. The simulation system of claim 10, wherein the third transmission interface serves as an interface for data transmission and an interface for specified control signals that control various integrated circuit control devices inside a peripheral device.

14. The simulation system of claim 10, wherein the first transmission interface that serves as a standard interface between the host computer and the peripheral device includes IEEE1394, USB, AC97, PCMCIA, SCSI, ATA, ATAPI, RS232 or Parallel.

15. The simulation system of claim 10, wherein the simulation firmware and its connection logic module uses a microprocessor to perform firmware simulation.

16. The simulation system of claim 10, wherein the simulation of the control mechanism of the core engine of a peripheral device can be carried out either by the second operating program inside the software simulation module or by the microprocessor inside the simulation firmware module.

17. The simulation system of claim 10, wherein the software of the software simulation module can be composed by any computer languages.

18. The simulation system of claim 10, wherein the second transmission interface includes RS232, Parallel, ECP, EPP, I$^2$C, SCSI, USB or IEEE1394.

* * * * *